(12) United States Patent
Kim

(10) Patent No.: US 9,214,163 B2
(45) Date of Patent: Dec. 15, 2015

(54) SPEECH PROCESSING APPARATUS AND METHOD

(75) Inventor: Ki Beom Kim, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 161 days.

(21) Appl. No.: 13/306,180

(22) Filed: Nov. 29, 2011

(65) Prior Publication Data

US 2012/0143603 A1 Jun. 7, 2012

(30) Foreign Application Priority Data

Dec. 1, 2010 (KR) .......................... 10-2010-0121309

(51) Int. Cl.
*G10L 21/0316* (2013.01)
*G10L 21/0364* (2013.01)
*H03G 3/30* (2006.01)

(52) U.S. Cl.
CPC .......... *G10L 21/0364* (2013.01); *H03G 3/3005* (2013.01)

(58) Field of Classification Search
CPC .. G10L 15/20; G10L 21/0316; G10L 21/0364
USPC ....................................................... 704/225
See application file for complete search history.

(56) References Cited

U.S. PATENT DOCUMENTS

| | | | | |
|---|---|---|---|---|
| 3,838,217 A | * | 9/1974 | Dreyfus ........................ | 704/225 |
| 4,630,305 A | * | 12/1986 | Borth et al. .................. | 381/94.3 |
| 4,747,143 A | * | 5/1988 | Kroeger et al. ............... | 704/225 |
| 5,870,705 A | * | 2/1999 | McAuliffe et al. ........... | 704/225 |
| 6,411,927 B1 | * | 6/2002 | Morin et al. .................. | 704/224 |
| 6,424,940 B1 | * | 7/2002 | Agassy et al. ................ | 704/219 |
| 6,523,003 B1 | * | 2/2003 | Chandran et al. ............ | 704/225 |
| 7,242,783 B1 | * | 7/2007 | Weeks et al. .................. | 381/98 |
| 7,398,207 B2 | * | 7/2008 | Riedl ............................ | 704/225 |
| 7,469,208 B1 | * | 12/2008 | Kincaid ........................ | 704/224 |
| 7,539,614 B2 | * | 5/2009 | Macours ....................... | 704/225 |
| RE43,985 E | * | 2/2013 | Vinton et al. ................. | 704/225 |
| 8,401,844 B2 | * | 3/2013 | Arakawa et al. ............. | 704/225 |
| 8,548,173 B2 | * | 10/2013 | Noguchi ....................... | 381/56 |
| 2002/0173864 A1 | * | 11/2002 | Smith ........................... | 700/94 |
| 2003/0055636 A1 | * | 3/2003 | Katuo et al. .................. | 704/225 |
| 2005/0108008 A1 | * | 5/2005 | Macours ....................... | 704/225 |
| 2006/0126865 A1 | * | 6/2006 | Blamey et al. ............... | 381/102 |
| 2006/0204020 A1 | * | 9/2006 | Le Tourneur et al. ........ | 381/94.1 |
| 2009/0192791 A1 | * | 7/2009 | El-Maleh et al. ............ | 704/219 |
| 2009/0259461 A1 | * | 10/2009 | Arakawa et al. ............. | 704/225 |
| 2009/0274310 A1 | * | 11/2009 | Taenzer ........................ | 381/57 |

(Continued)

*Primary Examiner* — Douglas Godbold
(74) *Attorney, Agent, or Firm* — Harness, Dickey & Pierce, P.L.C.

(57) ABSTRACT

A speech processing apparatus and method. The speech processing apparatus includes a microphone to receive a speech signal, an analog/digital converter to convert the speech signal generated by the microphone into a digital speech signal, and an automatic gain controller to calculate an average value of the magnitude of the digital speech signal generated by the analog/digital converter in a plurality of frames, to determine in which region of a speech signal band the average value is located, the speech signal band being divided into a plurality of regions according to the strength of speech, and to adjust gain according to a location of the average value on the speech signal band so that the strength of speech has a level of an optimal region capable of processing the speech signal. Accordingly, speech recognition may be maximized without being constrained by the distance of a speech source.

15 Claims, 5 Drawing Sheets

(56) References Cited

U.S. PATENT DOCUMENTS

2009/0281801 A1* 11/2009 Thyssen et al. ............... 704/225
2010/0121634 A1* 5/2010 Muesch ........................ 704/224
2011/0135129 A1* 6/2011 Neal .............................. 381/320
2011/0280409 A1* 11/2011 Michael et al. ................. 381/60
2012/0123769 A1* 5/2012 Urata ............................ 704/225
2012/0221328 A1* 8/2012 Muesch ........................ 704/225

* cited by examiner

SPEECH PROCESSING APPARATUS AND METHOD

CROSS-REFERENCE TO RELATED APPLICATIONS

This application claims the priority benefit of Korean Patent Application No. 10-2010-0121309, filed on Dec. 1, 2010 in the Korean Intellectual Property Office, the disclosure of which is incorporated herein by reference.

BACKGROUND

1. Field

One or more embodiments relate to a speech processing apparatus and method which automatically control gain of a microphone.

2. Description of the Related Art

Recently, as consumer's demands of speech recognition increase, robot products equipped with microphones have been developed and have come onto the market. When speech detected by a speech sensor has an audible frequency band or a high frequency band, a robot having a speech recognition sensor performs a single operation as directed by the speech.

A speech recognition means of a robot includes a microphone to which fixed gain or automatic gain is applied, a buffer to store speech source data which is input through the microphone, and a speech processor to process the stored speech source data. The robot operates according to speech recognition.

Meanwhile, the loudness of speech which is input to the microphone is determined by the distance between the microphone and a speaker and by the loudness of a speaker's voice. Most microphones adjust gain according to the distance between the microphones and speakers. However, since speakers tend to speak quietly when close to the microphone and tend to speak loudly when distant from the microphone, adjusting the gain based on distance alone may be problematic. That is, the adjustment of gain according to the distance between a microphone and a speaker has a problem in that it does not consider the volume of the speaker's voice.

SUMMARY

According to an aspect of one or more embodiments, there is provided a method to adjust gain based on the characteristics of a signal input to a microphone.

Additional aspects of one or more embodiments will be set forth in part in the description which follows and, in part, will be apparent from the description, or may be learned by practice of the invention.

In accordance with an aspect of one or more embodiments, a speech processing apparatus includes a microphone to receive a speech signal, an analog/digital converter to convert the speech signal generated by the microphone into a digital speech signal, and an automatic gain controller to calculate an average value of the magnitude of the digital speech signal generated by the analog/digital converter in a plurality of frames, to determine in which region of a speech signal band the average value is located, the speech signal band being divided into a plurality of regions according to the strength of speech, and to adjust gain according to a location of the average value on the speech signal band so that the strength of speech has a level of an optimal region capable of processing the speech signal.

The speech signal band may be divided into a plurality of regions based on a minimum limit level capable of being detected by the microphone, a maximum limit level capable of being detected by the microphone, low and high levels of the optimal region, and a median point of the speech signal band.

The automatic gain controller may amplify an input speech signal by raising the gain when the average value is less than or equal to the minimum limit level set on the speech signal band.

The automatic gain controller may not apply the adjusted gain to frames used for calculating the average value when amplifying the input speech signal by raising the gain when the average value is less than the minimum limit level set on the speech signal band.

The automatic gain controller may amplify an input speech signal by raising the gain when the average value is greater than the minimum limit level set on the speech signal band but less than or equal to the low level of the optimal region.

The automatic gain controller may apply the adjusted gain to frames used to the average value when amplifying the input speech signal by raising the gain when the average value is greater than the minimum limit level but less than the low level of the optimal region.

The automatic gain controller may not adjust the gain when the average value is greater than the low level and less than or equal to the high level of the optimal region.

The automatic gain controller may adjust the gain such that the strength of speech is tuned to the median point of the speech signal band when the average value is greater than the low level and less than or equal to the high level of the optimal region.

The automatic gain controller may reduce an input speech signal by lowering the gain when the average value is greater than the high level of the optimal region and less than or equal to the maximum limit level.

The automatic gain controller may apply the adjusted gain to frames used for calculating the average value when reducing the input speech signal by lowering the gain when the average value is greater than the high level of the optimal region and less than or equal to the maximum limit level.

The automatic gain controller may reduce greater than the maximum limit level.

The automatic gain controller may not apply the adjusted gain to frames used for calculating the average value when damping the input speech signal by lowering the gain when the average value is greater than the maximum limit level.

The speech processing apparatus may further include a speech processor to receive the digital speech signal from the automatic gain controller and process the digital speech signal, wherein the automatic gain controller divides the speech signal band into the plurality of regions using a speech magnitude variant gain of the speech processor as a parameter.

In accordance with another aspect of one or more embodiments, a speech processing method includes receiving an analog speech signal and converting the analog speech signal into a digital speech signal, and calculating an average value of the magnitude of the digital speech signal in a plurality of frames, to determine in which region of a speech signal band the average value is located, the speech signal band being divided into a plurality of regions according to the strength of speech, and to adjust gain according to a location of the average value on the speech signal band so that the strength of speech has a level of an optimal region capable of processing the speech signal.

The speech signal band may be divided into a plurality of regions based on a minimum limit level capable of being detected by a microphone, a maximum limit level capable of being detected by the microphone, low and high levels of the optimal region, and a median point of the speech signal band.

The adjustment of the gain may include adjusting the gain such that the strength of speech is greater than the low level and less than or equal to high level of the optimal region when the adjusted gain is applied to the average value of the plurality of frames.

The adjustment of the gain may include adjusting the gain such that the strength of speech is located at the median point of the speech signal band when the adjusted gain is applied to the average value of the plurality of frame.

BRIEF DESCRIPTION OF THE DRAWINGS

These and/or other aspects of one or more embodiments will become apparent and more readily appreciated from the following description of the embodiments, taken in conjunction with the accompanying drawings of which.

DETAILED DESCRIPTION

Figure 1:
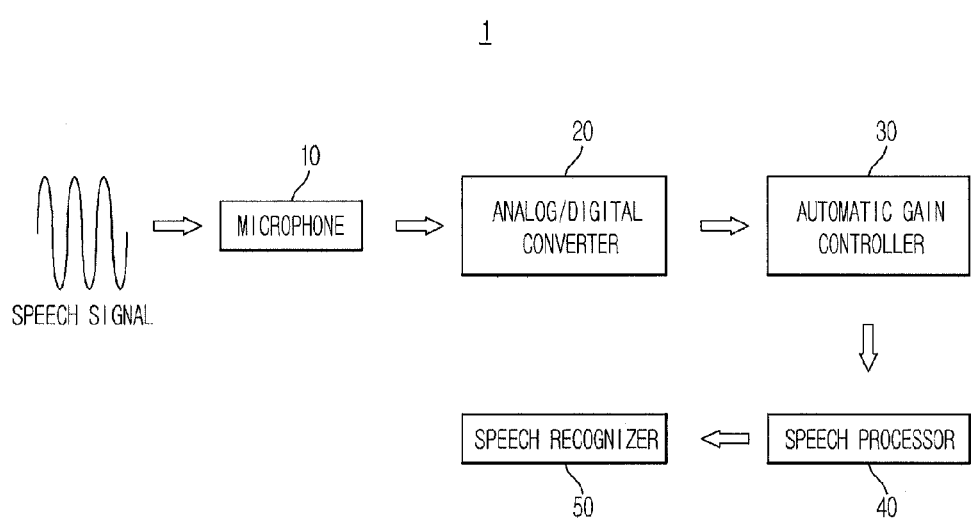
FIG. 1 is a functional block diagram of a speech processing apparatus according to an embodiment.

Reference will now be made in detail to one or more embodiments, examples of which are illustrated in the accompanying drawings, wherein like reference numerals refer to like elements throughout.

Figure 2:
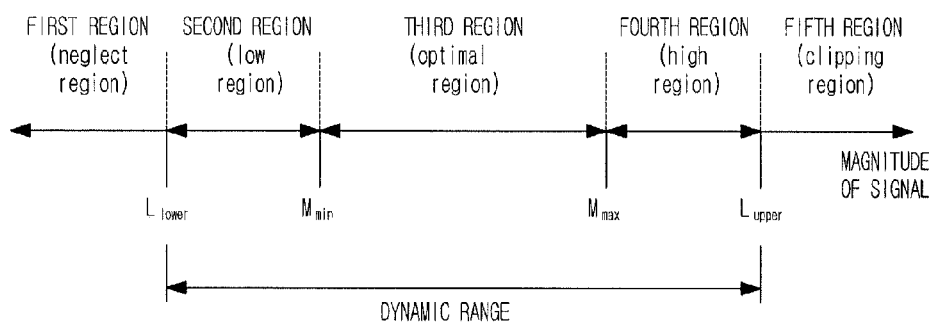
FIG. 2 is a diagram illustrating a magnitude region of a speech signal of a microphone of a speech processing apparatus according to an embodiment.
Figure 3:
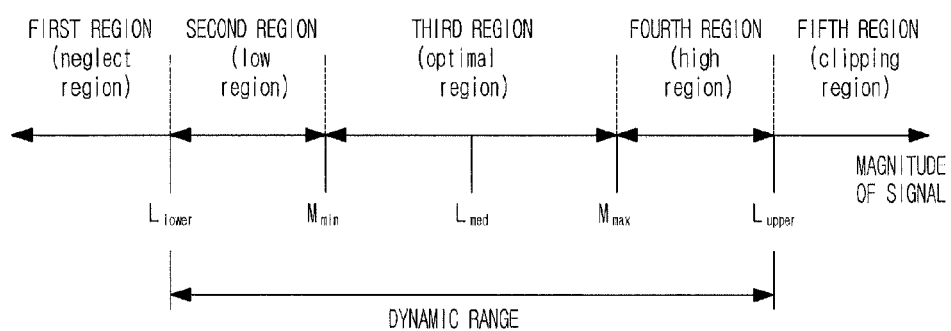
FIG. 3 is a diagram illustrating a median point of a magnitude region of a speech signal of FIG. 2 to describe another embodiment.

FIG. 1 is a functional block diagram of a speech processing apparatus according to an embodiment, FIG. 2 is a diagram illustrating a magnitude region of a speech signal of a microphone of a speech processing apparatus according to an embodiment, and FIG. 3 is a diagram illustrating a median point of a magnitude region of a speech signal of FIG. 2 to describe another embodiment.

A speech processing apparatus 1 may include a microphone 10, an analog/digital converter 20, an automatic gain controller 30, a speech processor 40, and a speech recognizer 50.

The microphone 10 receives a speech signal transmitted from a speaker.

The analog/digital converter 20 converts an analog speech signal which is input through the microphone 10 into a digital speech signal.

The automatic gain controller 30 adjusts gain of the digital speech signal. The automatic gain controller 30 transmits the gain-adjusted digital speech signal to the speech processor 40, such as a noise eliminator (not shown), which is configured in blocks suitable for specific purposes.

The automatic gain controller 30 controls gain based on the characteristics of the speech signal input directly to the microphone 10. The automatic gain controller 30 adjusts the magnitude of speech to a region suitable to be processed by the speech processor 40 before transmission to the speech recognizer 50.

Referring to FIG. 2, the automatic gain controller 30 divides a speech signal band into a plurality of regions according to the strength of speech. For example, the automatic gain controller 30 may split the magnitude of a speech signal into 5 regions:

first region: $M_{avg} \leq L_{lower}$;
second region: $L_{lower} < M_{avg} \leq M_{min}$;
third region $M_{min} < M_{avg} \leq M_{max}$;
fourth region: $M_{max} < M_{avg} \leq L_{upper}$; and
fifth region: $M_{avg} > L_{upper}$.

$M_{avg}$ denotes an average value of the magnitude of a frame unit of a speech signal input to the microphone 10 where the number of frames is predetermined; $L_{lower}$ denotes a minimum limit value of a dynamic range which is capable of being detected by the microphone 10; $L_{upper}$ denotes a maximum limit value of the dynamic range which is capable of being detected by the microphone 10; and $M_{min}$ and $M_{max}$ denote a low value and a high value, respectively, of an optimal region where a signal is capable of being processed within the dynamic range. $L_{lower}$ and $L_{upper}$ are determined according to the type and specification of the microphone 10, and $M_{min}$ and $M_{max}$ may be flexibly varied according to the speech processor 40 connected to the automatic gain controller 30 as will be described later.

The automatic gain controller 30 calculates the average of the magnitude of an input speech signal in the unit of frames and determines in which region the average value $M_{avg}$ is located, thereby adjusting gain. For example, the automatic gain controller 30 applies the adjusted gain to the average value of the magnitude of the input speech signal so that a region in which the average value is located may be in a third region of a dynamic range.

If it is determined that the average value $M_{avg}$ of the input speech signal is within a first region, that is, is less than or equal to the minimum limit value $L_{lower}$ of the dynamic range, the automatic gain controller 30 raises the gain and amplifies a next input signal by applying the adjusted gain thereto. In this case, a signal belonging to frames used for calculating the average value $M_{avg}$ of an initial speech signal is not used by the speech processor 40.

If it is determined that the average value $M_{avg}$ of the input speech signal is within a second region, that is, is greater than the minimum limit value $L_{lower}$ of the dynamic range but less than or equal to the low value $M_{min}$ of an optimal region capable of processing a signal within the dynamic range, the automatic gain controller 30 raises the gain and applies the adjusted gain to a next input signal. In this case, since a speech signal in the second region may be changed to a signal located in a third region, which is an optimal region, by applying the adjusted gain, a signal belonging to frames used for calculating the average value $M_{avg}$ of an initial speech signal may be processed in the speech processor 40 by applying the adjusted gain thereto.

If it is determined that the average value $M_{avg}$ of the input speech signal is within the third region, that is, is greater than the low value $M_{min}$ and less than or equal to the high value $M_{max}$ of the optimal region capable of processing a signal of the dynamic range, the automatic gain controller 30 transmits the input speech signal to the speech processor 40 without adjusting the gain.

If it is determined that the average value $M_{avg}$ of the input speech signal is within a fourth region, that is, is greater than the high value $M_{max}$ of the optimal region of the dynamic range and less than or equal to the maximum limit value $L_{upper}$, the automatic gain controller 30 reduces gain and applies the adjusted gain to a next input signal. In this case, since a speech signal in the fourth region may be changed to a signal located in a third region, which is an optimal region, by applying the adjusted gain, a signal belonging to frames used for calculating the average value $M_{avg}$ of an initial speech signal may be processed in the speech processor 40 by applying the adjusted gain thereto.

If it is determined that the average value $M_{avg}$ of the input speech signal is within a fifth region, that is, is greater than the maximum limit value $L_{upper}$, the automatic gain controller 30 lowers the gain and damps a next input signal by applying the adjusted gain. In this case, a signal belonging to frames used for calculating the average value $M_{avg}$ of an initial speech signal is not used by the speech processor 40.

The speech processor 40 receives a plurality of digital signals from the automatic gain controller 30 and processes the digital signals into speech signals which may be recognized by the speech recognizer 50.

The speech recognizer 50 may recognize speech by the speech signals processed by the speech processor 40.

Referring to FIG. 3, the automatic gain controller 30 divides the magnitude of a speech signal into 5 regions and additionally sets a median point of the magnitude of the speech signal:
first region: $M_{avg} \leq L_{lower}$;
second region: $L_{lower} < M_{avg} \leq M_{min}$;
third region: $M_{min} < M_{avg} \leq M_{max}$;
fourth region: $M_{max} < M_{avg} \leq L_{upper}$;
fifth region: $M_{avg} > L_{upper}$; and
median point: $L_{med}$.

$M_{avg}$ denotes an average value of the magnitude of a frame unit of a speech signal input to the microphone 10 where the number of frames is predetermined; $L_{lower}$ denotes a minimum limit value of a dynamic range which is capable of being detected by the microphone 10; $L_{upper}$ denotes a maximum limit value of the dynamic range which is capable of being detected by the microphone 10; $M_{min}$ and $M_{max}$ denote a low value and a high value, respectively, of an optimal region where a signal is capable of being processed within the dynamic range, and $L_{med}$ denotes a median point of a speech signal band.

The automatic gain controller 30 calculates the average of the magnitude of an input speech signal in the unit of frames and determines in which region the average value $M_{avg}$ is located, thereby adjusting gain. The automatic gain controller 30 applies the adjusted gain to the average value of the magnitude of the input speech signal so that a region in which the average value is located may be at the median point of the speech signal band of the dynamic range.

If it is determined that the average value $M_{avg}$ of the input speech signal is within a first region, that is, it is less than or equal to the minimum limit value $L_{lower}$ of the dynamic range, the automatic gain controller 30 raises the gain and amplifies a next input signal by applying the adjusted gain thereto. In this case, a signal belonging to frames used for calculating the average value $M_{avg}$ of an initial speech signal is not used by the speech processor 40.

If it is determined that the average value $M_{avg}$ of the input speech signal is within a second region, that is, is greater than the minimum limit value $L_{lower}$ of the dynamic range but less than or equal to the low value $M_{min}$ of an optimal region capable of processing a signal within the dynamic range, the automatic gain controller 30 raises the gain and applies the adjusted gain to a next input signal. In this case, since a speech signal in the second region may be changed to a signal located at the median point $L_{med}$ of the speech signal band of the dynamic range by applying the adjusted gain, a signal belonging to frames used for calculating the average value $M_{avg}$ of an initial speech signal may be processed in the speech processor 40 by applying the adjusted gain thereto.

If it is determined that the average value $M_{avg}$ of the input speech signal is greater than the low value $M_{min}$ and less than or equal to the high value $M_{max}$ of the optimal region capable of processing a signal of the dynamic range, the automatic gain controller 30 adjusts the gain so that the magnitude of the signal is adjusted to the median point $L_{med}$ of the speech signal band of the dynamic range.

If it is determined that the average value $M_{avg}$ of the input speech signal is within a fourth region, that is, is greater than the high value $M_{max}$ of the optimal region of the dynamic range and less than or equal to the maximum limit value $L_{upper}$, the automatic gain controller 30 reduces the gain and applies the adjusted gain to a next input signal. In this case, since a speech signal in the fourth region may be changed to a signal located at the median point $L_{med}$ of the speech signal band of the dynamic range by applying the adjusted gain, a signal belonging to frames used for calculating the average value $M_{avg}$ of an initial speech signal may be processed in the speech processor 40 by applying the adjusted gain thereto.

If it is determined that the average value $M_{avg}$ of the input speech signal is within a fifth region, that is, is greater than the maximum limit value $L_{upper}$, the automatic gain controller 30 lowers the gain and applies the adjusted gain to a next input signal. In this case, a signal belonging to frames used for calculating the average value $M_{avg}$ of an initial speech signal is not used by the speech processor 40.

The speech processor 40 receives a plurality of digital signals from the automatic gain controller 30 and processes the digital signals into speech signals which may be recognized by the speech recognizer 50.

The speech recognizer 50 may recognize speech by the speech signals processed by the speech processor 40.

Meanwhile, the automatic gain controller 30 may determine the low value $M_{min}$ and the high value $M_{max}$ of the optimal region in consideration of the function and specifications of the speech processor 40. The automatic gain controller 30 may determine the low value and $M_{min}$ and the high value $M_{max}$ in consideration of minimum and maximum speech magnitude variant gains $A_{min}$ and $A_{max}$ of the speech processor 40 as indicated in the following Equation 1.

$$M_{max} = k * L_{med} * A_{max}$$

$$M_{min} = k * L_{med} * A_{min} \quad \text{[Equation 1]}$$

In Equation 1, $M_{min}$ and $M_{max}$ denotes a low value and a high value, respectively, of an optimal region capable of processing a signal of a dynamic range, k (where k≥1) denotes any constant determined by a designer through experimentation, and $A_{max}$ and $A_{min}$ denote maximum and minimum speech magnitude variant gains, respectively. That is, the speech processor 40 may vary the magnitude of a speech signal using the maximum and minimum speech magnitude variant gains $A_{max}$ and $A_{min}$.

Referring to Equation 1, even though the maximum gain $A_{max}$ of the speech processor 40 is applied to the signal magnitude $L_{med}$ input to the speech processor 40, the applied result does not exceed the high value $M_{max}$. In addition, even though the minimum gain $A_{min}$ of the speech processor 40 is applied to the signal magnitude $L_{med}$ input to the speech processor 40, the applied result is not less than or equal to the low value $M_{min}$. That is, when the gain of the speech processor 40 is applied to a signal transmitted to the speech processor 40, the applied result is greater than the low value $M_{min}$ and less than equal to the high value $M_{max}$ of the optimal region.

The automatic gain controller 30 determines the low value $M_{min}$ and the high value $M_{max}$ such that the condition of the following Equation 2 may be satisfied.

$$A_{max} * M_{max} < L_{upper}$$

$$A_{min} * M_{min} > L_{lower}$$ [Equation 2]

The meaning of Equation 2 is that even if the maximum and minimum gains $A_{max}$ and $A_{min}$ are applied after the values $M_{max}$ and $M_{min}$ are transmitted to the speech processor 40, the applied results do not exceed a limit level within which the microphone 10 may recognize speech. Here, exceeding the limit level indicates that the applied results are less than the minimum limit value $L_{lower}$, or greater than the maximum limit value $L_{upper}$.

Figure 4:
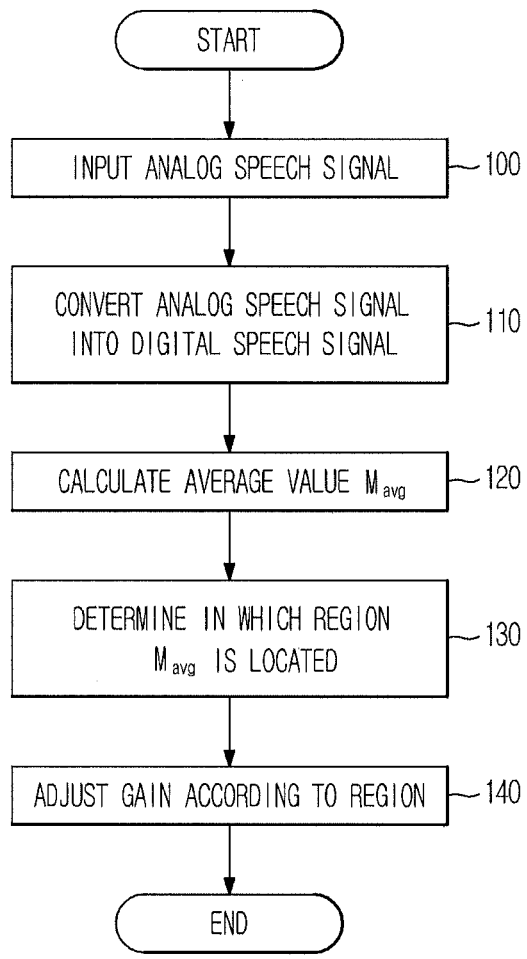
FIG. 4 is a control flow chart of a speech processing apparatus according to an embodiment.

FIG. 4 is a control flow chart of a speech processing apparatus according to an embodiment.

If an analog speech signal is input to the microphone 10 shown in FIG. 1 in operation 100, the analog/digital converter 20 converts the analog speech signal into a digital speech signal in operation 110.

Upon receiving the digital speech signal from the analog/digital converter 20, the automatic gain controller 30 calculates an average value $M_{avg}$ of the magnitude of the speech signal input to the microphone 10 in a plurality of frames in operation 120.

The automatic gain controller 30 determines in which region of a predetermined speech signal band the average value $M_{avg}$ is located in operation 130. The speech signal band includes a plurality of regions. For example, the speech signal band may include 5 regions as shown in FIG. 2 or FIG. 3.

The automatic gain controller 30 adjusts gain according to a region in which the average value $M_{avg}$ is located in operation 140.

Figure 5:
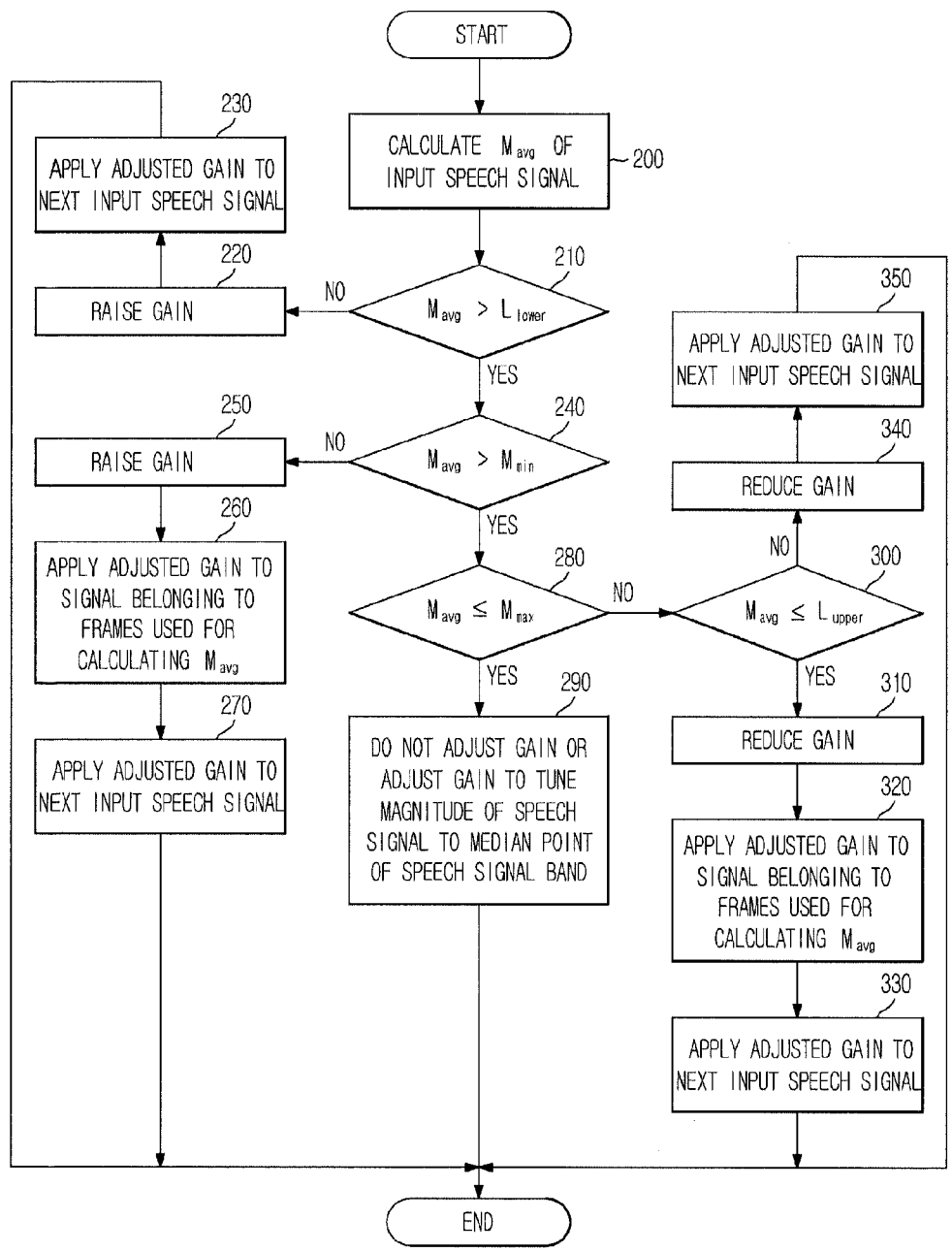
FIG. 5 is a flow chart to describe gain adjustment of a speech processing apparatus according to an embodiment.

FIG. 5 is a flow chart to describe gain adjustment of a speech processing apparatus according to an embodiment.

The automatic gain controller 30 calculates an average value $M_{avg}$ of an input speech signal in operation 200.

The automatic gain controller 30 determines whether the average value $M_{avg}$ is greater than a minimum limit value $L_{lower}$ of a dynamic range in operation 210. If the average value $M_{avg}$ is less than the minimum limit value $L_{lower}$, the automatic gain controller 30 raises gain in operation 220. That is, if it is determined that the average value $M_{avg}$ is less than or equal to the minimum limit value $L_{lower}$, the automatic gain controller 30 raises the gain and amplifies a next input signal by applying the adjusted gain in operation 230. In this case, a signal belonging to frames used for calculating the average value $M_{avg}$ of an initial speech signal is not used by the speech processor 40.

If the average value $M_{avg}$ is greater than the minimum limit value $L_{lower}$ in operation 210, the automatic gain controller 30 determines whether the average value $M_{avg}$ is greater than a low value $M_{min}$ of an optimal region capable of processing a signal within the dynamic range in operation 240. If it is determined that the average value $M_{avg}$ is greater than the minimum limit value $L_{lower}$ but less than or equal to the low value $M_{min}$ of the optimal region, the automatic gain controller 30 raises the gain in operation 250. The automatic gain controller 30 applies the adjusted gain to a signal belonging to frames used for calculating the average value $M_{avg}$ so as to be processed in the speech processor 40 in operation 260. The automatic gain controller 30 applies the adjusted gain to a next input signal in operation 270.

If the average value $M_{avg}$ is greater than the low value $M_{min}$ in operation 240, the automatic gain controller 30 determines whether the average value $M_{avg}$ is less than or equal to a high value $M_{max}$ of the optimal region capable of processing a signal of the dynamic range in steep 280. If it is determined that the average value $M_{avg}$ is greater than the low value $M_{min}$ and less than equal to the high value $M_{max}$, the automatic gain controller 30 does not adjust the gain or adjusts the gain so as to tune the magnitude of a signal to a median point $L_{med}$ of a speech signal band of the dynamic range in operation 290.

If the average value $M_{avg}$ of an input speech signal is greater than the high value $M_{max}$ in operation 280, the automatic gain controller determines whether the average value $M_{avg}$ is less than or equal to the maximum limit value $L_{upper}$ in operation 300. If it is determined that average value $M_{avg}$ is greater than the high value $M_{max}$ and less than equal to the maximum limit value $L_{upper}$, the automatic gain controller 30 reduces the gain in operation 310 and applies the adjusted gain to a signal belonging to frames used for calculating the average value $M_{avg}$ of an initial speech signal so as to be processed in the speech processor 40 in operation 320. The automatic gain controller 30 applies the adjusted gain to a next input signal in operation 330.

If it is determined that the average value $M_{avg}$ is greater than the upper limit value $L_{upper}$, the automatic gain controller 30 reduces the gain in operation 340 and applies the adjusted gain to a next input signal in operation 350. In this case, a signal belonging to frames used for calculating the average value $M_{avg}$ of an initial speech signal is not used by the speech processor 40.

Meanwhile, the adjustment of gain through the above processes represents that the gain is adjusted such that the strength of a speech signal is present in the third region shown in FIG. 2, that is, in an optimal region (greater than the low value $M_{min}$ and less than equal to the high value $M_{max}$) capable of processing a signal, or that the strength of a speech signal is present at the median point $L_{med}$ of the speech signal band shown in FIG. 3.

According to an aspect of one or more embodiments, speech recognition may be maximized without being constrained by the distance of a speech source.

The above-described embodiments may be recorded in computer-readable media including computer-readable instructions to implement various operations embodied by a computer. The media may also include, alone or in combination with the computer-readable instructions, data files, data structures, and the like. The computer-readable instructions recorded on the media may be those specially designed and constructed for the purposes of embodiments, or they may be of the kind well-known and available to those having skill in the computer software arts. Examples of computer-readable media include magnetic media such as hard disks, floppy disks, and magnetic tape; optical media such as CD ROM disks and DVDs; magneto-optical media such as optical disks; and hardware devices that are specially configured to store and perform computer readable instructions, such as read-only memory (ROM), random access memory (RAM), flash memory, and the like. The computer-readable media may also be a distributed network, so that the computer readable instructions are stored and executed in a distributed fashion. The computer readable instructions may be executed by one or more processors. The computer-readable media may also be embodied in at least one application specific integrated circuit (ASIC) or Field Programmable Gate Array (FPGA), which executes (processes like a processor) computer readable instructions. Examples of computer readable instructions include both machine code, such as produced by a compiler, and files containing higher level code that may be executed by the computer using an interpreter. The above-described devices may be configured to act as one or more software modules in order to perform the operations of the above-described embodiments, or vice versa.

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. A speech processing apparatus, comprising:
a microphone configured to receive a speech signal;
an analog/digital converter configured to convert the speech signal generated by the microphone into a digital speech signal; and
an automatic gain controller configured to calculate an average value of the magnitude of the digital speech signal generated by the analog/digital converter in a plurality of frames, where the number of frames is predetermined, determine in which region of a speech signal band the average value is located, the speech signal band being divided into a plurality of regions according to a strength of speech based on a dynamic range of the microphone, and adjust gain according to a corresponding one of the plurality of regions to which a location of the average value belongs so that the strength of speech has a level of an optimal region where the speech signal is capable of being processed,
wherein the speech signal band is divided into a plurality of regions based on a minimum limit capable of being detected by the microphone, a maximum limit level capable of being detected by the microphone, low and high levels of the optimal region, and a median point of the speech signal band.

2. The speech processing apparatus of claim 1, wherein the automatic gain controller is configured to amplify an input speech signal by raising the gain when the average value is less than or equal to the minimum limit level set on the speech signal band.

3. The speech processing apparatus of claim 2, wherein the automatic gain controller is configured to not apply the adjusted gain to frames used for calculating the average value when amplifying the input speech signal.

4. The speech processing apparatus of claim 1, wherein the automatic gain controller is configured to amplify an input speech signal by raising the gain when the average value is greater than the minimum limit level set on the speech signal band but less than or equal to the low level of the optimal region.

5. The speech processing apparatus of claim 4, wherein the automatic gain controller is configured to apply the adjusted gain to frames used for calculating the average value when amplifying the input speech signal.

6. The speech processing apparatus of claim 1, wherein the automatic gain controller is configured to not adjust the gain when the average value is greater than the low level and less than or equal to the high level of the optimal region.

7. The speech processing apparatus of claim 1, wherein the automatic gain controller is configured to adjust the gain such that the strength of speech is tuned to the median point of the speech signal band when the average value is greater than the low level and less than equal to the high level of the optimal region.

8. The speech processing apparatus of claim 1, wherein the automatic gain controller is configured to reduce an input speech signal by lowering the gain when the average value is greater than the high level of the optimal region and less than or equal to the maximum limit level.

9. The speech processing apparatus of claim 8, wherein the automatic gain controller is configured to apply the adjusted gain to frames used for calculating the average value when reducing the input speech signal.

10. The speech processing apparatus of claim 1, wherein the automatic gain controller is configured to reduce an input speech signal by lowering the gain when the average value is greater than the maximum limit level.

11. The speech processing apparatus of claim 10, wherein the automatic gain controller is configured to not apply the adjusted gain to frames used for calculating the average value when reducing the input speech signal.

12. The speech processing apparatus of claim 1, further comprising:
a speech processor configured to receive the digital speech signal from the automatic gain controller and process the digital speech signal, wherein the automatic gain controller is configured to divide the speech signal band into the plurality of regions using a speech magnitude variant gain of the speech processor as a parameter.

13. A speech processing method, comprising:
receiving an analog speech signal from a microphone;
converting the analog speech signal into a digital speech signal;
calculating an average value of the magnitude of the digital speech signal in a plurality of frames, where the number of frames is predetermined;
determining in which region of a speech signal band the average value is located, the speech signal band being divided into a plurality of regions according to a strength of speech based on a dynamic range of the microphone; and
adjusting gain according to a corresponding one of the plurality of regions to which a location of the average value belongs so that the strength of speech has a level of an optimal region where the speech signal is capable of being processed,
wherein the speech signal band is divided into a plurality of regions based on a minimum limit level capable of being detected by a microphone, a maximum limit level capable of being detected by the microphone, low and high levels of the optimal region, and a median point of the speech signal band.

14. The speech processing method of claim 13, wherein the adjustment of the gain includes adjusting the gain such that the strength of speech is greater than the low level and less than or equal to the high level of the optimal region when the adjusted gain is applied to the average value of the plurality of frames.

15. The speech processing method of claim 13, wherein the adjustment of the gain includes adjusting the gain such that the strength of speech is located at the median point of the speech signal band when the adjusted gain is applied to the average value of the plurality of frames.

* * * * *